US006995568B2

(12) United States Patent
Hald et al.

(10) Patent No.: US 6,995,568 B2
(45) Date of Patent: Feb. 7, 2006

(54) METHOD FOR FAULT TRACING IN ELECTRONIC MEASUREMENT AND TEST ARRANGEMENTS FOR ELECTROCHEMICAL ELEMENTS

(75) Inventors: Rainer Hald, Ellwangen (DE); Peter Haug, Ellwangen (DE); Dejan Ilic, Ellwangen (DE); Willi Wallkum, Stödtlen (DE); Peter Birke, Ellwangen (DE)

(73) Assignee: Varta Microbattery GmbH, (DE)

( * ) Notice: Subject to any disclaimer, the term of this patent is extended or adjusted under 35 U.S.C. 154(b) by 0 days.

(21) Appl. No.: 10/704,783

(22) Filed: Nov. 10, 2003

(65) Prior Publication Data

US 2004/0183541 A1    Sep. 23, 2004

(30) Foreign Application Priority Data

Mar. 20, 2003   (DE) ................................. 103 13 786

(51) Int. Cl.
*G01R 31/28* (2006.01)

(52) U.S. Cl. ...................................... 324/528; 324/439
(58) Field of Classification Search ................ 324/527, 324/528, 426, 430–434; 29/730; 320/137, 320/138, 161, 162
See application file for complete search history.

(56) References Cited

U.S. PATENT DOCUMENTS

| 5,460,904 A | 10/1995 | Gozdz et al. ................ 429/316 |
| 5,623,196 A * | 4/1997 | Fernandez et al. .......... 320/153 |
| 6,693,431 B1 * | 2/2004 | Leyde et al. ................. 324/434 |
| 2003/0182793 A1 * | 10/2003 | Hald et al. ..................... 29/730 |

FOREIGN PATENT DOCUMENTS

| DE | 102 13 685.8 | 10/2003 |
| GB | 2 157 507 A | 10/1985 |

* cited by examiner

*Primary Examiner*—Vincent Q. Nguyen
(74) *Attorney, Agent, or Firm*—DLA Piper Rudnick Gray Cary US LLP

(57) ABSTRACT

A method for fault tracing in automatically operating electronic measurement and test arrangements for a large number of electrochemical elements, wherein holders for the electrochemical elements are provided on the measurement and test arrangements and wherein cell simulators are provided with an external shape and size, including electrical connections, which approximately simulate one of the electrochemical elements to be tested, and contain test electronics, with a behaviour of the cell simulators with inverse polarity differing to a major extent from a behaviour with polarity based on the application, including the steps of inserting of the cell simulators into the holders, activating one of the cell simulators and applying a measurement current applied to it, measuring the voltage on the cell simulator and comparing the voltage with the nominal voltage predetermined for the cell simulator.

4 Claims, 3 Drawing Sheets

METHOD FOR FAULT TRACING IN ELECTRONIC MEASUREMENT AND TEST ARRANGEMENTS FOR ELECTROCHEMICAL ELEMENTS

FIELD OF THE INVENTION

The invention is related to a method for fault tracing in automatically operating electronic measurement and test arrangements for a large number of electrochemical elements, as well as an apparatus which is suitable in particular for carrying out this method.

BACKGROUND

Rechargeable electrochemical elements, in particular lithium cells, in many cases contain a cell stack which comprises two or more individual elements. The individual cells or individual elements from which a cell stack such as this is composed are a laminate which is produced from output conductors, an active electrode film and a separator. Laminates such as these composed of firmly connected individual parts are produced in particular as so-called "bicells" with the following possible sequences: negative electrode/separator/positive electrode/separator/negative electrode, or positive electrode/separator/negative electrode/separator/positive electrode.

Methods for producing such rechargeable lithium ion batteries are described in U.S. Pat. No. 5,460,904. Two or more bicells are arranged in layers to form a stack which, after insertion into a container composed, for example, of thermoformed aluminum composite sheet, filling with electrolyte, sealing with a cover, formation and final closure, is processed to form a complete battery.

Highly automated measurement devices are used for electrical testing of batteries in the battery industry. In the field of rechargeable batteries, these systems are also able to form the batteries by carrying out one or more charge/discharge cycles. In order to achieve high throughput rates, these systems are in general fully automated.

The formation of a large number of electrochemical elements requires complex apparatuses, in which electrical contact is made with the output conductors of the cells during the formation process, and in which the cells are held. In general, a large number of flat cells are inserted alongside one another into recesses in a holder, a so-called "formation tray," with the recesses being matched to the cell cross section. In this case, the output conductor lugs of the flat cells point in one direction and are, for example, clamped in between contact springs which are in the form of plates and are arranged on mount apparatuses. However, contact can also be made with the output conductor lugs by pushing contact pins onto them.

During the testing of the battery characteristics, the batteries are measured serially, that is to say one after another, with the test duration generally being less than 1 second. Longer lasting tests or operations are, however, carried out with two or more batteries in parallel, that is to say at the same time. For this purpose, the batteries are introduced into special containers and are supplied to the appropriate system automatically or by hand. These systems are generally computer-controlled, and defective batteries are segregated automatically. The test or operation is carried out with constant currents or current pulses and/or constant voltages. An apparatus such as this is known, for example, from DE 102 13 685.8 A1.

The contact-making devices are provided with connecting cables corresponding to the number of batteries, and have four connections per cell. Several thousand or ten thousand batteries are usually processed at the same time in systems for battery formation. Each individual battery is connected to one channel of the control, measurement and regulation electronics. The large number of cables and control electronics channels that this results in can lead to faults both during installation and during operation.

Manual testing of the connections during construction of the system is highly complex, requiring a long time and a large amount of work in difficult conditions. Faults can often not be detected during operation, and this thus leads to incorrect measurements and incorrect actions.

SUMMARY OF THE INVENTION

This invention provides a method and an apparatus which is suitable, in particular, for carrying out the method, and which allows fault tracing to be carried out simply, quickly and in a manner which can be fully automated, and allows precautionary problem identification.

According to the invention, cell simulators are inserted into the holders or formation trays which are provided for the electrochemical elements and whose external shape and size, including the electrical connections, simulate or model an electrochemical element and contain test electronics, whose behaviour with inverse polarity differs to a major extent from the behaviour with polarity based on the application. One cell simulator is in each case activated and has a measurement current applied to it, with the voltage and/or the voltage response then being measured on the cell simulator and being compared with a nominal voltage value, which is predetermined for this cell simulator, or with a nominal voltage response. This may be done, for example, at predetermined time intervals.

The cell simulators contain test electronics which may at least comprise a resistor and a diode connected in parallel. Two or more cell simulators are advantageously arranged alongside one another or adjacent to one another. In this case, they may each differ slightly from one another, for example they may have a different voltage response behaviour. This can be achieved, for example, by means of different impedances, thus making it easy to distinguish between the individual cell simulators.

These and further features are evident not only from the claims but also from the description and the drawings, wherein the individual features may each be implemented on their own or in combinations of two or more in the form of subcombinations for an embodiment of the invention and for other fields, and may represent advantageous embodiments which are patentable in their own right and for which protection is claimed here. The subdivision of the application into individual sections as well as intermediate headings do not restrict the generality of the statements made below them.

BRIEF DESCRIPTION OF THE DRAWINGS

The subject-matter of the invention will be explained in more detail in the following text with reference to the schematic figures, in which.

DETAILED DESCRIPTION

Figure 1:
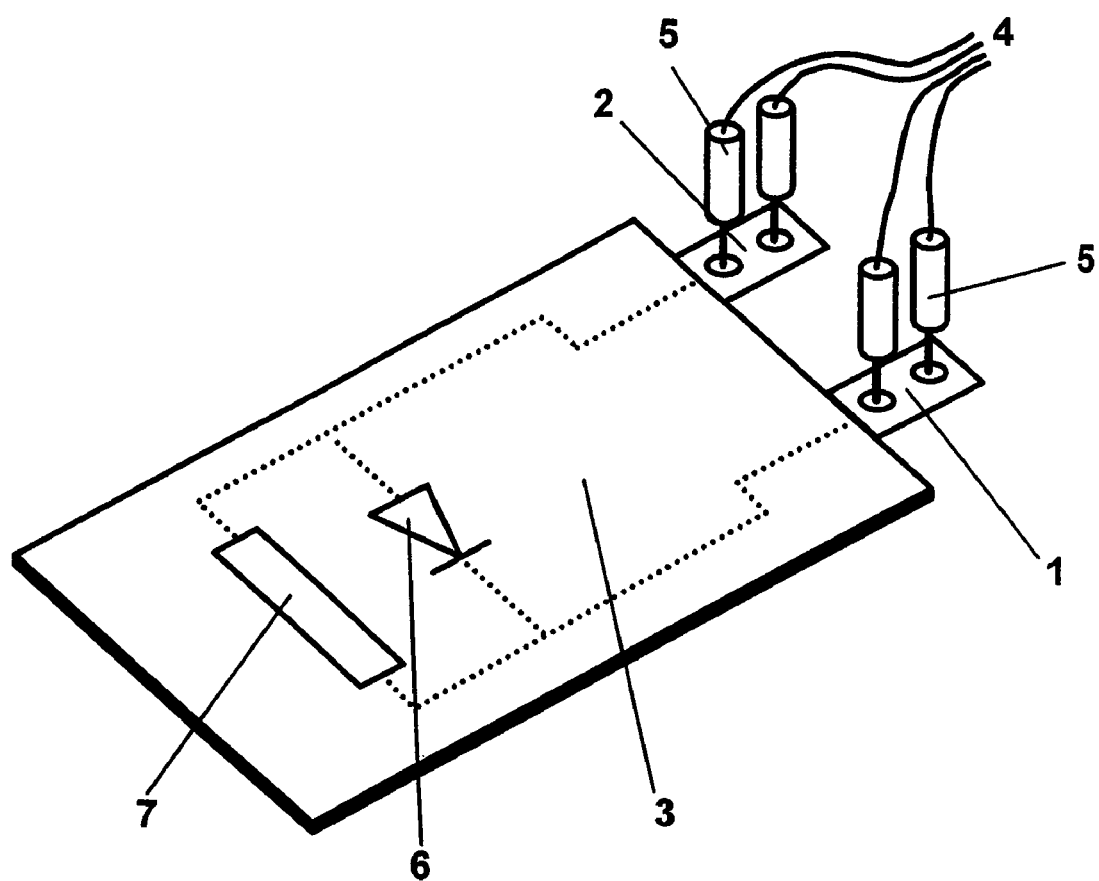
FIG. 1 shows a cell simulator according to the invention.

FIG. 1 shows, schematically, the design of a cell simulator 9, comprising a printed circuit board 3 which contains test electronics, which comprise at least a resistor 7 and a diode 6 connected in parallel. The cell simulator 9 also contains the positive output conductor 1 and the negative output conductor 2. The output conductors are connected to a power supply and to a test apparatus via four contact pins 5, which are combined in a line 4. Instead of using the contact pins, contact can also be made with the output conductors via contact springs which are fitted on both sides. The two output conductors may, for example, be composed of a nickel strip with a thickness of 100 µm and a width of 5 mm and are connected, for example by means of a soldering process, to the conductor tracks of the test electronics on the printed circuit board. The dimensions of the external shape and size of the cell simulator correspond to the electrochemical element to be tested or to be formed.

Figure 2:
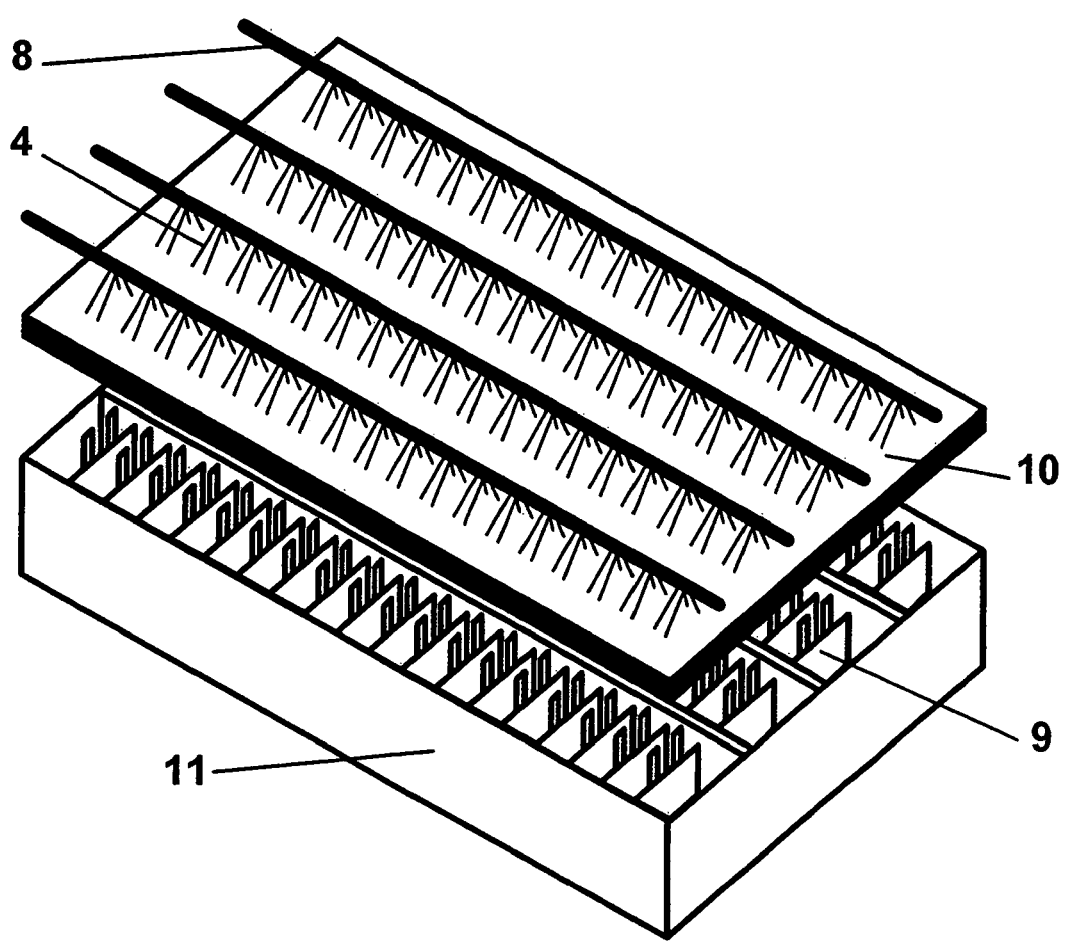
FIG. 2 shows the electrical connection of the apparatus.

FIG. 2 shows a so-called_"formation tray"_ 11 which is used as a holder for a large number of flat cells or cell simulators 9 arranged alongside one another. The individual flat cells are in this case arranged in recesses in the holder, and the recesses are matched to the cell cross section.

The contact-making unit 10 contains the contact pins 5 and the contact springs for making contact with the cells or cell simulators 9. The contact pins 5 and the contact springs are connected to the lines 4 that are combined in the cable harness 8.

The formation locations that are provided in a formation system are subdivided into logical blocks. There may, for example, be 24 576 locations in 192 blocks, each having 128 locations. Each block corresponds to a system compartment for holding a formation tray 11. Each system compartment contains a contact-making unit 10 for making contact with the cells in a formation tray. Four electrical connections 4 are produced per cell to the control and regulation electronics of the system. Each control channel is connected to one cell or to one cell simulator 9.

A formation tray which is fitted with the cell simulators described above is inserted, for example by means of a rack controller, into the system compartment to be tested. The cell simulators are then electrically connected to the controller or control system by closing the contact-making unit.

For the fault tracing process according to the invention, it is essential for adjacent cell simulators to have a different behaviour in order, for example, to identify interchanged lines between adjacent channels or cells. Since the lines of up to four adjacent channels can be interchanged, four different cell simulators are arranged in a regularly repetitive manner, as is illustrated in FIG. 2.

Figure 3:
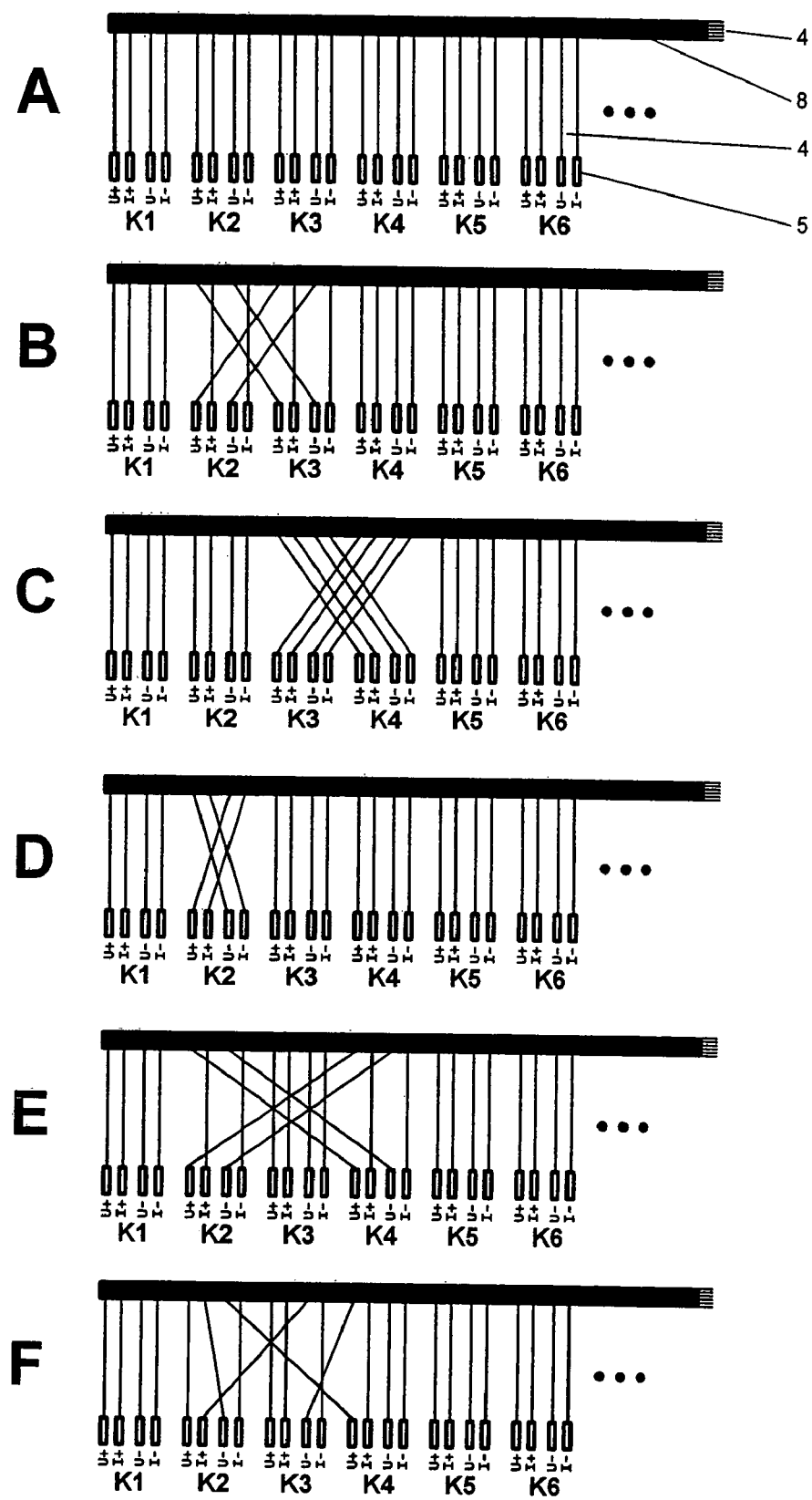
FIG. 3 shows a schematic circuit diagram of various faults which are identified by the method according to the invention.

FIG. 3A shows, schematically, the lines 4 combined to form a cable harness 8, and the four contact-making devices 5 for each cell or cell simulator. Four lines (U+, U−, I+, I−) lead from each channel of the control electronics to one cell, corresponding to a four-wire measurement method. The designations K1, K2 etc. each describe one channel of the measurement and control electronics, or a cell or cell simulator.

All the cells or cell simulators in a formation tray 11 are always made contact with at the same time via the contact-making unit 10 by virtue of the system design.

FIGS. 3B and 3C show the necessity to test each channel individually and to use cell simulators with a different behaviour. If the measurement lines (U+, U−) and/or the power lines (I+, I−) of one channel are interchanged in pairs with the measurement lines of another channel, then the fault can be identified only if only one channel is in each case active, that is to say is live, and adjacent cell simulators have a different behaviour. Since the arrangement or sequence of the various cell simulators is known, the expected measured value for each individual channel is also known. It is thus possible to detect the faults mentioned above.

FIG. 3D shows the necessity for the cell simulators to have a different behaviour with inverse polarity.

FIGS. 3E and 3F show further possible faults which are identified by the method according to the invention.

The various cell simulators must be designed such that they differ significantly from one another and from the behaviour with inverse polarity, taking into account all the component and measurement tolerances. When using, for example, four different cell simulators, the voltage drop when current flows through the respective cell simulator could be 2.7 V; 3.3 V; 3.9 V or 4.7 V and, with inverse polarity, 1.0 V.

These four different types of cell simulators differ in the value of the resistance that is used, for example 27, 33, 39, and 47 Ohms. They are arranged alongside one another and in a regularly repeating manner in the formation tray.

The test current and the value of the resistors R must be chosen such that the resultant voltage drop is considerably greater than the forward voltage of the diode, that is to say for example 1.0 V. However, at the same time, it is necessary to ensure that the resultant voltage is still within the permissible measurement and control range of the controller or control system.

For example: resistance R: 27/33/39/47 Ohms

V   forward voltage of the diode D: 1.0 measurement and control range of the controller or control system: 0 to 5.5 V
test current: 100 mA
→ with U = R*I, this results in a voltage drop of: 2.7/3.3/3.9/4.7 V The measurement and control electronics channel to be tested is activated, that is to say a defined current is applied. All the other channels are deactivated, that is to say no current flows. Once a short transient time has elapsed, the current is measured and a test is carried out to determine whether the measured value is within the predetermined tolerance window. If this is not the case, the test channel and/or the associated wiring are/is not serviceable. Otherwise, the test is continued with the measurement of the resultant voltage on the cell simulator. The measured value is compared with the predetermined value or tolerance window for this cell simulator type. If the value is outside the window, then the test channel and/or the associated wiring are/is not serviceable. This procedure is repeated for all the channels to be tested.

In principle, only one channel of the controller or control system is active. All the other channels are deactivated, that is to say they have a high impedance. The respectively active channel has a constant current of, for example, 100 mA applied to it via the controller or control system. Once the stabilization time has elapsed (for example 17 seconds), the controller or control system measures the cell voltage and the current and checks whether both values are within the permissible range. In order to identify any possible oscillation, this measurement and test is repeated after a further 3 or 7 seconds.

The permissible value range for the voltage is calculated from the tolerance of the resistance on the cell simulator, from the voltage measurement inaccuracy of the controller or control system, and from the inaccuracy of the current regulation. The permissible current value range is governed by the inaccuracy of the current regulation. The values and tolerances of the resistors must be chosen such that the resultant permissible ranges are not infringed.

The procedure described above is repeated successively for all the cell positions in the formation tray.

According to the invention, a cell simulator is provided with the same shape and size as the battery to be tested, and test electronics are integrated on or in it. Formation trays may be filled with cell simulators such as these, so that the complete set of connections can be tested in one measurement.

When cell simulators with a systematically graduated conductance are used, it is also possible to identify interchanged wiring between adjacent locations. When test electronics comprising a resistor and a parallel-connected diode are used, it is also possible to detect interchanged polarity. Since the measurement process is computer-controlled, faults can be reported with a detailed fault description.

A container with permanently installed cell simulators can also be used as the test object, and is passed through the system automatically at defined time intervals.

This makes it possible to avoid complex and expensive manual work in difficult conditions, and the reliability of the test is better.

The method according to the invention and the associated apparatus allow the detection of discontinuities in one or more lines since it is either impossible for any current to flow and/or an incorrect voltage is measured. It is also possible to identify polarity reversal of one or more lines per cell. The diode which is connected in the reverse-biased direction in parallel with the resistor on the cell simulator becomes forward-biased, and the measured voltage is equal to the forward voltage of the diode, since this is considerably less than the expected voltage.

Since only one channel is ever activated at the same time and adjacent cell simulators have different resistances, the interchanging of one or more lines of one cell with the lines of one or more adjacent cells is identified.

Since the four-wire measurement method is used here, a poor electrical contact in the plug connectors or between the contact-making unit and the cell does not lead to problems unless the contact resistance that results from this is so great that the controller or control system can no longer regulate the voltage. In this case, the values which are measured by the controller or control system are outside the tolerance band, and the fault is thus identified by the test method.

If one or more channels of the control electronics is or are defective, or if the measurement and/or regulation accuracy of one or more channels of the control electronics are/is out of tolerance, the measured values are not within the permissible range.

In one exemplary embodiment, the invention includes a method for fault tracing in automatically operating electronic measurement and test arrangements for a large number of electrochemical elements. Cell simulators are inserted into the holders provided for the electrochemical elements. The external shape and size, including the electrical connections, of these cell simulators simulate an electrochemical element. The cell simulators contain test electronics, whose behaviour with inverse polarity differs to a major extent from the behaviour with polarity based on the application. One cell simulator is activated and has a measurement current applied to it. The voltage and/or voltage response on the cell simulator are/is then measured, and are/is compared with the nominal voltage value predetermined for this cell simulator. The test electronics comprise at least a resistor and a diode connected in parallel.

What is claimed is:

1. A method for fault tracing in automatically operating electronic measurement and test arrangements for a large number of electrochemical elements, wherein holders for said electrochemical elements are provided on said measurement and test arrangements and wherein cell simulators are provided with an external shape and size, including electrical connections, which approximately simulate one of said electrochemical elements to be tested, and contain test electronics, with a behaviour of said cell simulators with inverse polarity differing to a major extent from a behaviour with polarity based on the application, comprising:

inserting said cell simulators into said holders,
   activating one of said cell simulators and applying a measurement current applied to it,
   measuring the voltage on said cell simulator and comparing the voltage with the nominal voltage predetermined for said cell simulator.

2. The method according to claim 1, wherein, before measurement of said voltage on said cell simulator, a measurement current is compared in predetermined time intervals with said predetermined nominal value.

3. The method according to claim 1, wherein two or more of said cell simulators are arranged adjacent to one another.

4. The method according to claim 3, wherein adjacent cell simulators each have a different behaviour.

* * * * *